United States Patent [19]

Gaines et al.

[11] Patent Number: 5,363,395
[45] Date of Patent: Nov. 8, 1994

[54] BLUE-GREEN INJECTION LASER STRUCTURE UTILIZING II-VI COMPOUNDS

[75] Inventors: James M. Gaines; Ronald R. Drenten, both of Mohegan Lake; Kevin W. Haberern, Hopewell Junction; Thomas M. Marshall, Brooklyn; Piotr M. Mensz, Ossining; John Petruzzello, Carmel, all of N.Y.

[73] Assignee: North American Philips Corporation, New York, N.Y.

[21] Appl. No.: 159,755

[22] Filed: Nov. 30, 1993

Related U.S. Application Data

[63] Continuation of Ser. No. 997,988, Dec. 28, 1992, abandoned.

[51] Int. Cl.$^5$ ................................. H01S 3/19
[52] U.S. Cl. .................................. 372/45; 372/50; 257/76; 257/78
[58] Field of Search ................. 372/43–50; 257/76, 78

[56] References Cited

U.S. PATENT DOCUMENTS

| | | | |
|---|---|---|---|
| 4,794,606 | 12/1988 | Kondow et al. | 372/45 |
| 5,010,376 | 4/1991 | Nishimura et al. | 372/44 |
| 5,091,758 | 12/1992 | Morita | 257/78 |
| 5,250,814 | 10/1993 | Morita | 257/13 |
| 5,260,958 | 11/1993 | Fitzpatrick | 372/45 |
| 5,268,918 | 12/1993 | Akimoto et al. | 372/45 |
| 5,291,506 | 3/1994 | Ahn | 372/43 |
| 5,299,217 | 3/1994 | Migita et al. | 372/45 |

*Primary Examiner*—Frank Gonzalez
*Attorney, Agent, or Firm*—William L. Botjer

[57] ABSTRACT

A blue-green II/VI semiconductor injection laser utilizing a $Zn_{1-u}Cd_uSe$ active layer (quantum well) having $Zn_{1-x}Mg_xS_ySe_{1-y}$ cladding layers and $ZnS_zSe_{1-z}$ guiding layers on a GaAs substrate. These devices are operable in a pulse mode at room temperature.

19 Claims, 2 Drawing Sheets

BLUE-GREEN INJECTION LASER STRUCTURE UTILIZING II-VI COMPOUNDS

This is a continuation of application Ser. No. 07/997,988, filed on Dec. 28, 1992, now abandoned.

BACKGROUND AND SUMMARY OF THE INVENTION

This invention relates to semiconductor lasers and particularly to semiconductor injection lasers manufactured from II/VI materials and operating in the blue-green region.

Semiconductor lasers comprised of III/V materials operating in the red and infrared regions are commonly found in optical data storage applications. If laser devices operating at shorter wavelengths such as green, blue/green and blue were available, the data storage density of optical data storage devices could be increased. However, practical semiconductor laser diodes operating at the shorter wavelengths have not as yet been manufactured. The prior art has focussed on a variety of means for utilizing II/VI materials to provide shorter wavelength semiconductor lasers.

Blue-green II/VI semiconductor injection lasers have been produced by Haase, et al. ("Blue-Green Laser Diodes", Appl. Phys. Lett. 59 (11), 9 Sep. 1991) using a separate-confinement heterostructure (SCH) configuration. These lasers have $ZnS_{0.06}Se_{0.94}$ cladding layers, a ZnSe waveguiding region, and a $Cd_{0.2}Zn_{0.8}Se$ quantum-well active region. Although this structure has provided room-temperature pulsed and low-temperature continuous operation, it has the disadvantage that it cannot be grown with all layers pseudomorphic to the GaAs substrate. Pseudomorphic lasers can be made without separate confinement, by omitting the ZnSe guiding region, but additional quantum wells are required to compensate for the reduction in optical confinement. Consequently, the threshold current density increases. Also, the improvement in optical confinement obtained by additional quantum wells is limited, because the large lattice mismatch (about 1.5%) between $Cd_{0.2}Zn_{0.8}Se$ and $ZnS_{0.06}Se_{0.94}$ limits the total thickness of $Cd_{0.2}Zn_{0.8}Se$.

Growth of $Zn_{1-x}Mg_xS_ySe_{1-y}$ materials by MBE has been demonstrated by Okuyama, et al (Jap. J. App. Phys. 30, L1620 (1991)). They have implemented $Zn_{1-x}Mg_xS_ySe_{1-y}$ cladding layers in optically pumped lasers operating at temperatures up to 500K and in 77K multi-quantum-well p-n injection lasers without separate confinement. The use of $Zn_{1-x}Mg_xS_ySe_{1-y}$ for II/VI lasers is also shown in U.S. patent application Ser. No. 815,686, filed Dec. 31, 1991 now U.S. Pat. No. 5,260,958 issued Nov. 9, 1993.

The present invention is directed to a blue-green II/VI separate confinement semiconductor injection laser utilizing a $Zn_{1-u}Cd_uSe$ active layer (quantum well) having $Zn_{1-x}Mg_xS_ySe_{1-y}$ cladding layers and $ZnS_zSe_{1-z}$ guiding layers and a GaAs substrate. The devices are operable in a pulsed mode at room temperature. The use of quaternary $Zn_{1-x}Mg_xS_ySe_{1-y}$ cladding layers permits both lattice matching of all layers, and an increase of the cladding and guiding layer bandgaps. Thus, lasers can be made with improved electrical and optical confinement. Alternatively, the band-gap of the active region may be increased to yield lasing at shorter wavelengths (u=0).

BRIEF DESCRIPTION OF THE DRAWINGS

In order for a better understanding of the invention, reference is made to the following drawings in which.

DESCRIPTION OF THE PREFERRED EMBODIMENTS

Figure 1B:
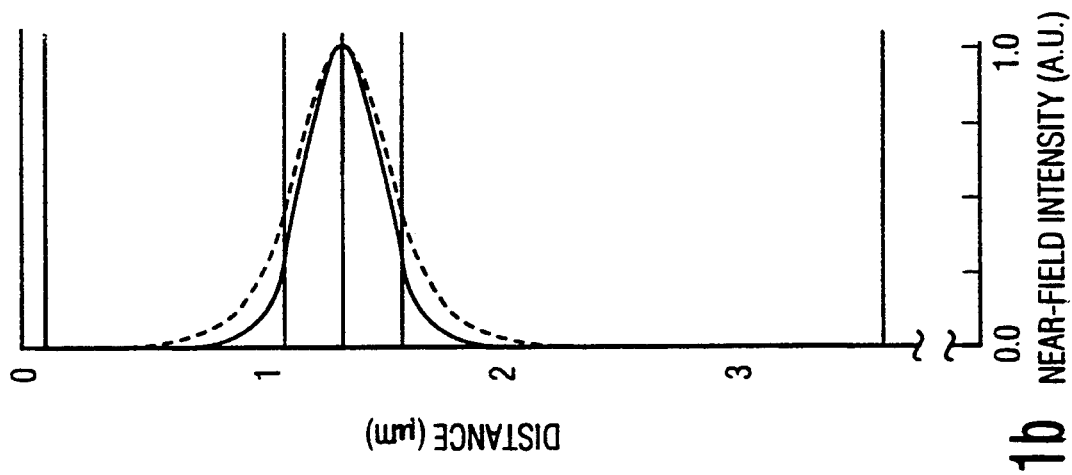
FIG. 1a is a sectional view of the layered structure of the II/VI laser construction in accordance with the invention and FIG. 1b illustrates the near-field light output of the device.

FIG. 1 illustrates the structure of the invention. The structure includes a GaAs:Si substrate 10 which, by doping with silicon, is n-type. Grown on the substrate 10 is a cladding layer 12 of $Zn_{1-x}Mg_xS_ySe_{1-y}$:Cl, which, by its doping with Cl is n-type. Grown atop cladding layer 12 is an optical guiding layer 14 of $ZnS_zSe_{1-z}$:Cl which is n-type. Grown atop waveguide layer 14 is the active quantum well layer 16 of $Zn_{1-u}Cd_uSe$. Grown on active layer 16 is a p-type guiding layer 18 comprising $ZnS_zSe_{1-z}$:N. Grown atop guiding layer 18 is a p-type cladding layer 20 of $Zn_{1-x}Mg_xS_ySe_{1-y}$:N. Disposed on layer 20 is a p-type contact layer 22 of ZnSe:N. Gain-guided lasers were fabricated. A polyimide insulator layer 24 with stripe openings 25 of 50 μm width is applied to the top of the epitaxial layer 22. Contacts to the p-ZnSe and the n-GaAs were made with a Au layer 26 and a In layer 28, respectively. The device was cleaved to a length of about 1 mm. The devices were typically operated with pulse lengths of 10–50 ns and a repetition rate of 1 kHz (duty cycle=1-5×$10^5$).

Figure 1A:
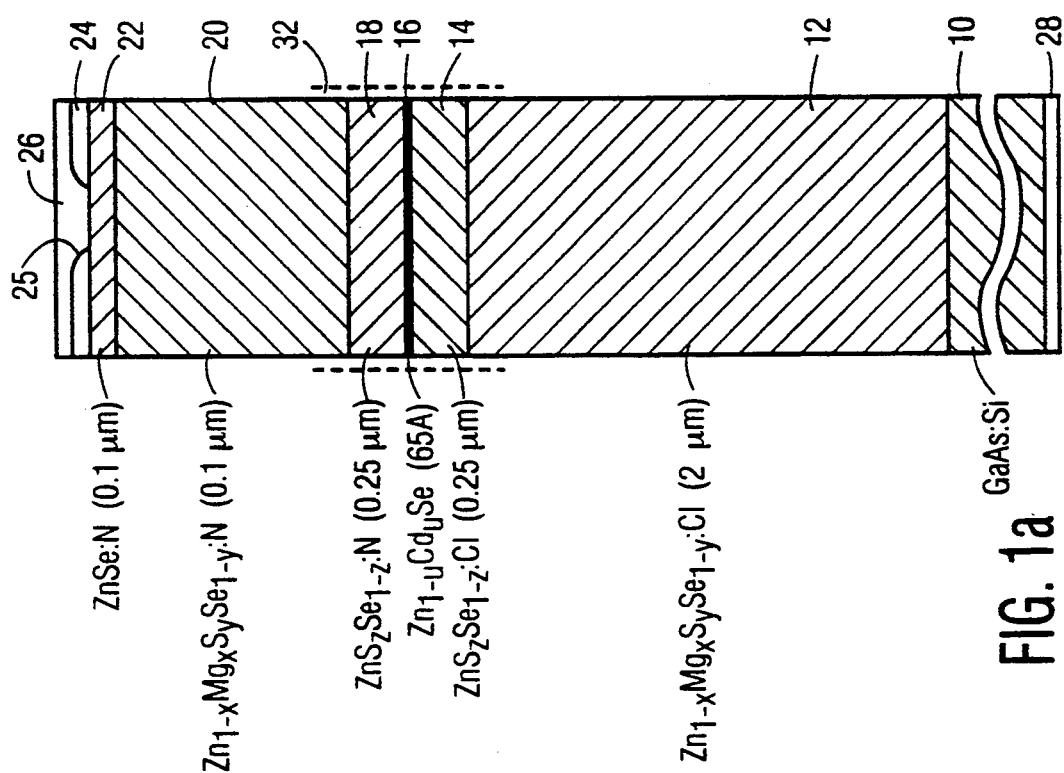

The laser structure shown in FIG. 1a was grown by molecular beam epitaxy (MBE) on a (100) GaAs:Si substrate. Source materials were Zn, Se, Cd, Mg, and ZnS. The p- and n-type dopants were N, excited by a plasma source, and Cl (from $ZnCl_2$), respectively. The doping levels ($N_a-N_d$) in the p-ZnSe, p- $ZnS_zSe_{1-z}$ and p-$Zn_{1-x}Mg_xS_ySe_{1-y}$ regions are approximately $1\times10^{18}$, $3\times10^{17}$ cm$^{-3}$, and $2\times10^{17}$ cm$^{-3}$, respectively. The doping level in the n-$ZnS_zSe_{1-z}$ and n-$Zn_{1-x}Mg_xS_ySe_{1-y}$ is $2\times10^{17}$ cm$^{-3}$, except for the first 1000Å of the $Zn_{1-x}Mg_xS_ySe_{1-y}$ layer, which is doped at $2\times10^{18}$ cm$^{-3}$. In the exemplary embodiment the $Zn_{1-u}Cd_uSe$ layer has a u value of 0.2, and in the $ZnS_zSe_{1-z}$ layer the value of z was 0.06. For the $Zn_{1-x}Mg_xS_ySe_{1-y}$ layers, x and y are each approximately 0.1. In this embodiment, the band-gap of the $Zn_{1-x}Mg_xS_ySe_{1-y}$, determined by photoluminescence, is about 2.95 eV (at 4K), and the index of refraction (at room temperature), determined by the prism-coupling method, is 2.625 at 515 nm.

The thickness of each of the layers is grown in a manner so as to minimize the loss of light in absorbing layers and maximize the amount of light in the active region. By way of example only, useful devices were formed with a n-type cladding layer 12 of 2 microns, an n-type guiding layer 14 of 0.25 microns, a quantum well layer 16 of 65 Angstroms, a p-type confinement layer 18 of 0.25 microns, a p-type cladding layer 20 of 1 micron, and a p-type contact layer 22 of 0.1 microns. Suitable ranges for u (Cadmium) are from 0 to 0.4, z from 0 to 0.1, y from 0.06 to 1 and x from 0 to 1. However, x and y must be selected so as to provide lattice matching to the GaAs. In order to improve the optical output of the device, facet coatings 30, 32 may be applied to the device. The cleaving of the device to its useful length provides the necessary "mirror" action to provide laser stimulation. The light output of the device may be shifted towards blue by reducing the thickness of active layer 16 and/or by reducing the cadmium content of this layer (u approaches 0).

FIG. 1b illustrates the near field intensity (in arbitrary units) of the light generated by the structure of FIG. 1a. The near field pattern for the analogous structure without magnesium (x=0) is shown in the dashed line. It is seen that the structure has improved optical confinement with most of the light confined within the quantum well and confinement layers. A clear improvement is thus seen in the optical confinement for the laser containing $Zn_{1-x}Mg_xS_ySe_{1-y}$ over $Zn_zS_{1-z}Se$. Devices constructed in accordance with the present invention also show improved electrical confinement and a reduction in defects as compared to previous constructions.

The growth of the active layer 16 may be facilitated by the growth of a thin ($\approx 15\text{Å}$) layer of ZnSe on one or both sides of the active layer. The use of this ZnSe layer or layers can simplify the accurate growth of the active layer. Depending on the application analogous structure having more than 1 active layer may also be grown. Additionally, the structure described above is applicable to index guided lasers as well.

Figure 2:
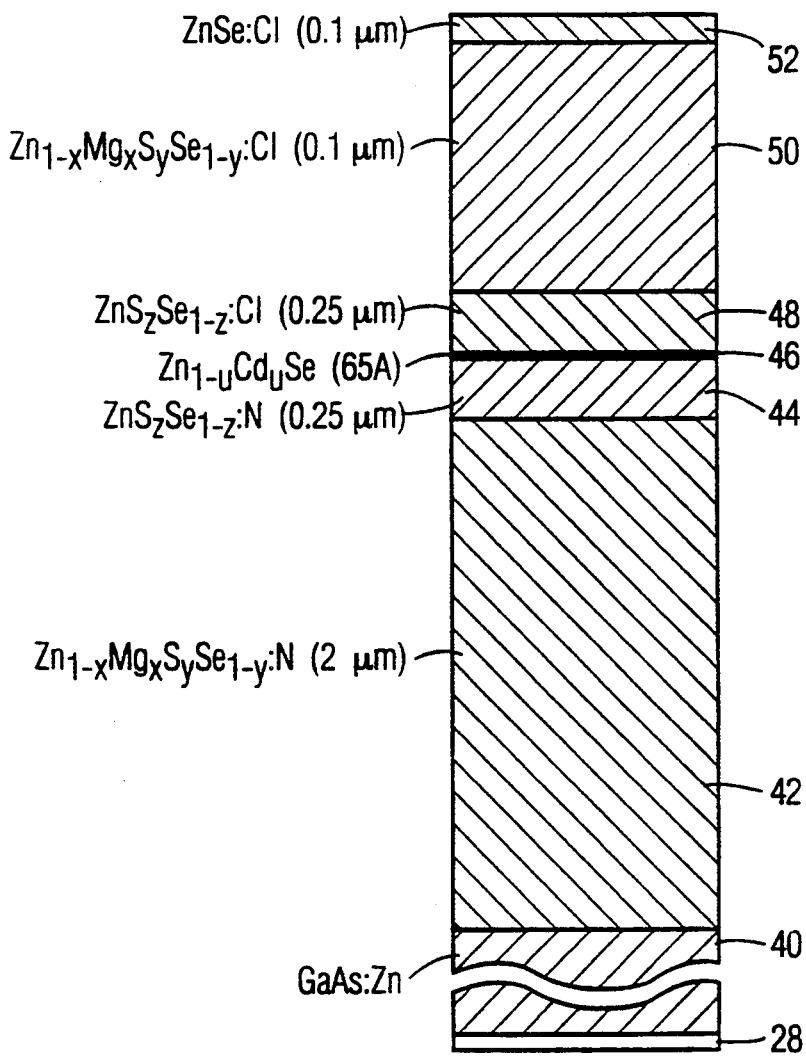
FIG. 2 illustrates a second embodiment of the device utilizing a p-type substrate.

In the above described embodiment of FIG. 1a, the substrate and lower layers are n-type with the upper layers p-type. An analogous structure can be grown with the lower layers p-type and the upper layers n-type. In the embodiment of FIG. 2, the substrate 40 is p-type, such as GaAs:Zn with a p-type lower cladding layer 42 of $Zn_{1-x}Mg_xS_ySe_{1-y}$:N disposed atop the substrate and a p-type $ZnS_zSe_{1-z}$:N guiding layer 44. The $Zn_{1-u}Cd_uSe$ active layer 46 remains the same as in FIG. 1a with a $ZnS_zSe_{1-z}$:Cl n-type upper guiding layer 48, n-type $Zn_{1-x}Mg_xS_ySe_{1-y}$:Cl upper cladding layer 50 and a n-type ZnSe:Cl contact layer 52. The doping levels of the layers of the structure of FIG. 2 are generally similar to the levels of the layers in FIG. 1a.

Although the present invention has been described in conjunction with preferred embodiments, it is to be understood that modifications and variations may be resorted to without departing from the spirit and scope of the invention, as those skilled in the art will readily understand. Such modification and variations are considered to be within the purview and scope of the invention and the appended claims.

What is claimed is:

1. A laser structure comprising:
(a) a substrate of a first conductivity type;
(b) a cladding layer of $Zn_{1-x}Mg_xS_ySe_{1-y}$ of said first conductivity type, disposed atop said substrate;
(c) a guiding layer of $ZnS_zSe_{1-z}$ of said first conductivity type, disposed atop said first conductivity type cladding layer;
(d) an active layer of $Zn_{1-u}Cd_uSe$, disposed atop said first conductivity type guiding layer;
(e) a guiding layer of $ZnS_zSe_{1-z}$ of a second conductivity type opposite said first conductivity type, disposed atop said active layer;
(f) a cladding layer of $Zn_{1-x}Mg_xS_ySe_{1-y}$ of said second conductivity type; and
(g) wherein $0 \leq u \leq 0.4$; $0 \leq z \; 0.1$; $0 \leq x \leq 1$ and $0.06 \leq y \leq 1$, x and y being chosen such that the cladding layers are lattice matched with said substrate.

2. The laser structure as claimed in claim 1 wherein said first conductivity type is n and said second conductivity type is p.

3. The laser structure as claimed in claim 1 further including a second conductivity type contact layer disposed upon said second conductivity type cladding layer.

4. The laser structure as claimed in claim 1 wherein said substrate comprises GaAs.

5. The laser structure as claimed in claim 4 wherein said GaAs is doped with silicon.

6. The laser structure as claimed in claim 1 wherein at least one of said cladding layers and said guiding layers are made n-type by doping with Cl.

7. The laser structure as claimed in claim 1 wherein at least one of said guiding layers and said cladding layers are doped with nitrogen.

8. The laser structure as claimed in claim 1 wherein u=0.2; z=0.06 x=0.1 and y=0.1.

9. The LASER structure as claimed in claim 1 wherein said first conductivity type is p and said second conductivity type is n.

10. A structure for emitting light comprising:
(a) a substrate of a first conductivity type;
(b) a cladding layer of $Zn_{1-x}Mg_xS_ySe_{1-y}$ of said first conductivity type, disposed atop said substrate;
(c) a guiding layer of said first conductivity type, disposed atop said first conductivity type cladding layer;
(d) an active layer of $Zn_{1-u}Cd_uSe$, disposed atop said first conductivity type guiding layer;
(e) a guiding layer of a second conductivity type opposite said first conductivity type, disposed atop said active layer;
(f) a cladding layer of $Zn_{1-2x}Mg_xS_ySe_{1-y}$ of said second conductivity type; and
(g) wherein $0 \leq u \leq 0.4$; $0 \leq x \leq 1$ and $0.06 \leq y \leq 1$, x and y being chosen such that the cladding layers are lattice matched with said substrate.

11. The structure as claimed in claim 10 wherein said first conductivity type is n and said second conductivity type is p.

12. The structure as claimed in claim 10 further including a second conductivity type contact layer disposed upon said second conductivity type cladding layer.

13. The structure as claimed in claim 10 wherein said substrate comprises GaAs.

14. The structure as claimed in claim 13 wherein said GaAs is doped with silicon.

15. The structure as claimed in claim 10 wherein at least one of said cladding layers and said guiding layers are made n-type by doping with cl.

16. The structure as claimed in claim 10 wherein at least one of said guiding layers and said cladding layers are doped with nitrogen.

17. The structure as claimed in claim 10 wherein u=0.2; x=0.1 and y=0.1.

18. The structure as claimed in claim 16 wherein said first conductivity type is p and said second conductivity type is n.

19. The structure as claimed in claim 10 wherein said guiding layer comprises $ZnS_zSe_{1-z}$ wherein $0 \leq Z \leq 0.1$.

* * * * *